(12) United States Patent
Cheng et al.

(10) Patent No.: US 7,026,644 B2
(45) Date of Patent: Apr. 11, 2006

(54) ORGANIC THIN FILM TRANSISTOR ARRAY SUBSTRATE

(75) Inventors: Horng-Long Cheng, Hsinchu (TW); Wei-Yang Chou, Tainan (TW); Yih-Jun Wong, Tainan (TW); Yu-Wu Wang, Taichung (TW); Cheng-Chung Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/990,210

(22) Filed: Nov. 16, 2004

(65) Prior Publication Data

US 2005/0087745 A1 Apr. 28, 2005

Related U.S. Application Data

(62) Division of application No. 10/637,259, filed on Aug. 8, 2003, now Pat. No. 6,872,980.

(30) Foreign Application Priority Data

Apr. 15, 2003 (TW) .............................. 92108629 A

(51) Int. Cl.
*H01L 29/004* (2006.01)

(52) U.S. Cl. .......................... 257/40; 257/72; 349/106; 349/110

(58) Field of Classification Search ................. 257/40, 257/72; 359/112
See application file for complete search history.

(56) References Cited

U.S. PATENT DOCUMENTS 5,892,244 A * 4/1999 Tanaka et al. ................ 257/40

* cited by examiner

*Primary Examiner*—David Nelms
*Assistant Examiner*—Thinh T Nguyen
(74) *Attorney, Agent, or Firm*—Quintero Law Office

(57) ABSTRACT

The invention provides an organic thin film transistor array substrate, comprising: a substrate, having a liquid crystal display area and an organic thin film transistor area; a pixel electrode, formed on the substrate in the LCD area; a first alignment film, formed on the pixel electrode; a second alignment film, formed on the substrate in the OTFT area; an organic semiconductor layer, formed on the second alignment film, wherein the organic semiconductor layer is aligned along the direction of the second alignment film; and a gate, a source and a drain, formed in the OTFT area, wherein the source and the drain are in contact with the organic semiconductor layer and a channel is formed between the source and the drain.

7 Claims, 7 Drawing Sheets

ORGANIC THIN FILM TRANSISTOR ARRAY SUBSTRATE

This application is a divisional of U.S. application Ser. No. 10/637,259, filed Aug. 8, 2003 now U.S. Pat. No. 6,872,980.

BACKGROUND OF THE INVENTION

1. Field of the Invention

The invention provides an organic thin film transistor array substrate, and in particular, an organic thin film transistor array substrate having an alignment film, formed in the same process step using the same material, in the OTFT area and the LCD area.

2. Description of the Related Art

Organic semiconductor material has been lauded by many international research institutes, as one of the most promising materials for producing thin film transistors and other electronic and optic-electro elements. Sirringhaus etc. of the University of Cambridge, discloses the process of producing OTFT by self-organization of organic molecules to obtain alignment of various anisotropic structures. Better alignment of the molecular chain results in enhanced electric charge transportation efficiency. Carrier mobility of the transistor increases at least 100 times, thereby proving that the alignment of organic molecules does have importance in enhancing electric properties (Nature, Vol. 401, p. 685, 1999).

Organic thin film transistors use an organic layer as the active layer, and have been applied in driving liquid crystal displays (LCDs). In order to simplify process and reduce production costs, an integration of LCD and OTFT on the same substrate (monolithically) has been proposed.

Kabushiki Kaisha Toshiba discloses in U.S. Pat. No. 5,355,235, the incorporation of a bottom-gate OTFT structure having two organic layers for a permissive LCD.

Mitshubishi Denki Kabushiki Kaisha discloses in U.S. Pat. No. 6,060,333 the incorporation of bottom gate OTFT structure for a permissive or reflective LCD. In this method, OTFT exhibits unsatisfactory electric properties and there is no LC alignment film.

Hitachi Ltd. Discloses in U.S. Pat. No. 6,300,988 B1 the incorporation of a bottom gate OTFT structure with an LCD. A patterned insulation layer is used to pattern the deposited organic semiconductor, such that the channel region and the non-channel region are isolated. As a result, leakage and crosstalk among elements are reduced. However, the organic semiconductor in the OTFT not control the alignment, thus the electrical properties are unsatisfactory and the process is more complicated.

In the above-mentioned OTFT and LCD integrated elements, the organic semiconductor of the OTFT is not aligned; therefore electrical properties are not satisfactory and do not meet circuit design requirements. Additionally, if compatible OTFT and LCD processes are not utilized properly, process complexity increases.

SUMMARY OF THE INVENTION

Due to the previously mentioned problems, the object of the invention is to provide an OTFT array substrate, produced by an integrated OTFT and LCD process. An alignment film is formed to provide organic semiconductor arrangement, thus improving the electrical properties of the OTFT.

Another object of the invention is to provide an OTFT array substrate having a first alignment film on the pixel electrode in the LCD area for aligning liquid crystal; and a second alignment film in the OTFT area for aligning the organic semiconductor material to increase carrier transport efficiency. Electrical properties of the elements are thus improved to meet circuit design requirements. Moreover, the first alignment film and the second alignment film are composed of the same material and formed in the same process step. Thus, the process is greatly simplified.

In order to achieve the above objects, the invention provides an organic thin film transistor array substrate, comprised of: a substrate having a liquid crystal display (LCD) area and an organic thin film transistor (OTFT) area; a pixel electrode, formed in the LCD area in the substrate; a first alignment film, formed on the pixel electrode; a second alignment film, formed in the OTFT area in the substrate; an organic semiconductor layer, formed on the second alignment film, and the organic semiconductor layer is aligned along the direction of the second alignment film; and a gate, source and a drain, formed in the OTFT area, wherein the source and the drain are in contact with the organic semiconductor layer and a channel formed between the source and the drain According to the invention, the method of producing the organic OTFT array substrate is as follows: providing a substrate having LCD and OTFT areas; forming a pixel electrode in the LCD area of the substrate; forming a first dielectric layer on the pixel electrode, and forming a second dielectric layer in the OTFT area of the substrate; patterning the first dielectric layer to form a first alignment film, and patterning the second dielectric layer to form a second alignment film; forming an organic semiconductor layer on the second alignment film, and the organic semiconductor layer is aligned along the direction of the second alignment film; and forming a gate, a source, and a drain in the OTFT area, wherein the source and the drain are in contact with the organic semiconductor layer and a channel is formed between the source and the drain.

When the OTFT is a bottom gate type, the method of the invention includes the following steps: providing a substrate having LCD and OTFT areas; forming a conductive layer on the substrate, and patterning the conductive layer to form a pixel electrode in the LCD area and a gate in the OTFT area; forming a first dielectric layer on the pixel electrode, and forming a second dielectric layer on the substrate in the OTFT area to cover the gate; patterning the first dielectric layer and the second dielectric layer to form a first alignment film and a second alignment film respectively; and forming an organic semiconductor layer on the second alignment film, and a source and a drain in the OTFT area, wherein the organic semiconductor layer is aligned along the second alignment film, and the source and the drain are in contact with the organic semiconductor layer, and a channel is formed between the source and the drain.

When the OTFT is top gate type, the method of the invention includes the steps of: providing a substrate having LCD and OTFT areas; forming a pixel electrode on the substrate in the LCD area; forming a first dielectric layer on the pixel electrode, and a second dielectric layer on the substrate in the OTFT area; patterning the first dielectric layer and the second dielectric layer to form a first alignment film and a second alignment film respectively; forming an organic semiconductor layer on the second alignment film, and a source and a drain in the OTFT area, wherein the organic semiconductor layer is aligned along the second alignment film, and the source and the drain are in contact with the organic semiconductor layer, and a channel is formed between the source and the drain; forming an insulation layer on the organic semiconductor layer, the source and the drain; and forming a gate on the insulation layer.

The invention also provides a liquid crystal display including an organic thin film transistor array substrate, comprising an organic thin film transistor array substrate, a filter substrate and liquid crystal between the organic thin film transistor array substrate and the filter substrate, wherein the organic thin film transistor array substrate comprises: a substrate having an LCD area and an organic thin film transistor (OTFT) area; a pixel electrode, formed on the substrate in the LCD area; a first alignment film, formed on the pixel electrode; a second alignment film, formed on the substrate in the OTFT area; an organic semiconductor layer, formed on the second alignment film, wherein the organic semiconductor layer is aligned along the direction of the second alignment film; and a gate, a source and a drain, formed in the OTFT area, wherein the source and the drain are in contact with the organic semiconductor layer, and a channel is formed between the source and the drain.

A detailed description is given in the following embodiments with reference to the accompanying drawings.

BRIEF DESCRIPTION OF THE DRAWING

The present invention can be more fully understood by reading the subsequent detailed description and examples with references made to the accompanying drawings, wherein.

DETAILED DESCRIPTION OF THE INVENTION

FIGS. 1a~1f illustrate cross sections of the method for producing an LCD having a bottom gate type OTFT substrate according to the first embodiment of the invention.

Figure 1A:
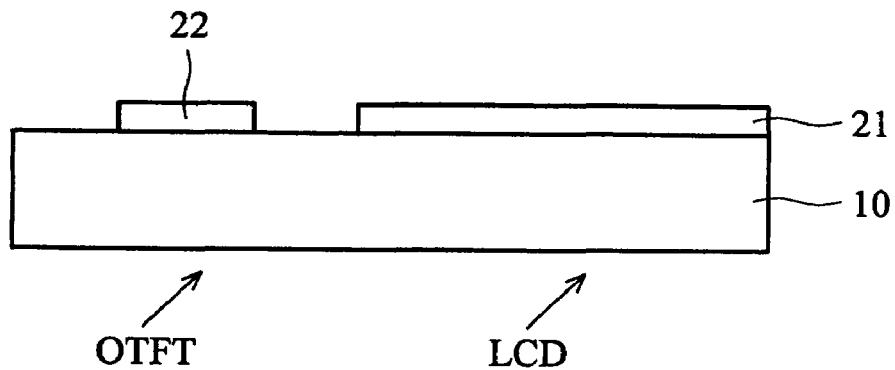
FIGS. 1a~1f illustrate cross sections of the method of producing an LCD having a bottom gate type OTFT substrate according to the first embodiment of the invention.

In FIG. 1a, a substrate 10 having LCD and OTFT areas is provided. Suitable substrates are silicon wafer, glass, and quartz, plastic or flexible substrates. A transparent conductive layer (not shown), preferably ITO, ZnO or conductive polylmer material, is formed on the substrate 10. The transparent conductive layer is then patterned by photolithography, or etching to form a pixel electrode 21 in the LCD area and a gate 22 in the OTFT area. Alternatively, printing is also applicable to form the pixel electrode 21 and the gate 22 directly.

Figure 1B:
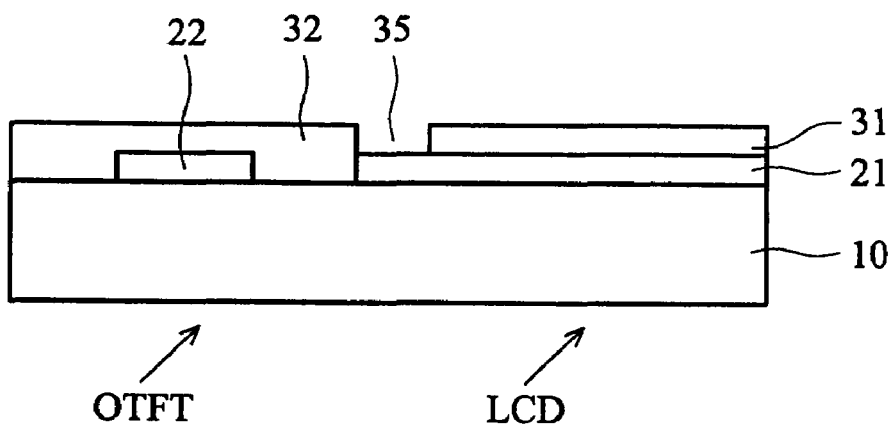

Next, in FIG. 1b, a dielectric layer (not shown) is formed in the LCD area and the OTFT area to cover the pixel electrode 21 and the gate 22. Then, the dielectric layer is patterned to form an opening 35, wherein the dielectric layer is divided into two parts: a first dielectric layer 31 on the pixel electrode 21 and a second dielectric layer 32 on the gate 22. The dielectric layer is patterned by photolithography and etching. Printing is also applicable in forming the first dielectric layer 31 and the second dielectric layer 32 directly.

Figure 1C:
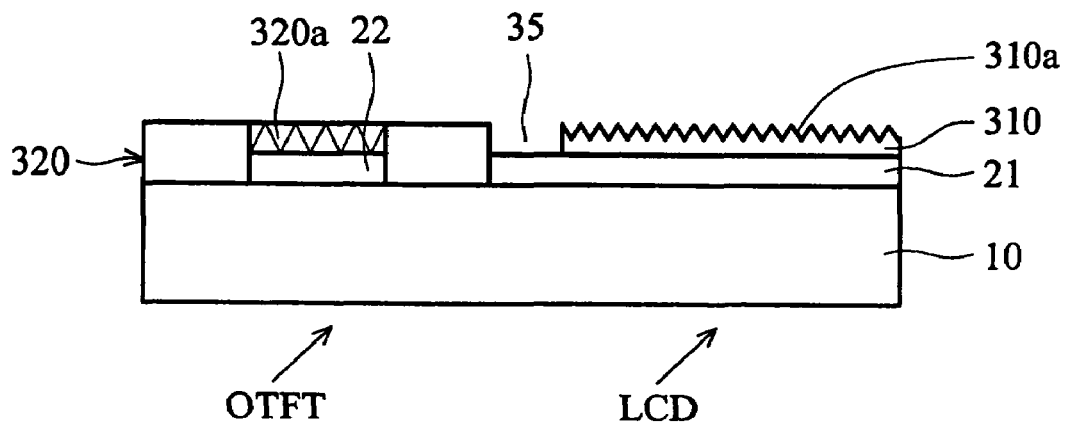

Next, in FIG. 1c, the first dielectric layer 31 is patterned to form a first alignment film 310, wherein a first microgroove 310a is formed on the surface of the first alignment film 310. Similarly, the second dielectric layer 32 is patterned to form a second alignment film 32, and a second microgroove 320a is formed on the surface of the second alignment film 320. As shown in the figure, the second alignment film is not entirely aligned (microgroove), while the portion marked 320a is.

The alignment of the first microgroove 310a and the second microgroove 320a is identical. Alternatively, they can be different to meet various requirements of LCD area and the OTFT area to obtain the optimum results.

According to the invention, patterning of the first dielectric layer 31 and the second dielectric layer 32 is not restricted; a method such as exposure/development is also applicable. The first dielectric layer 31 and the second dielectric layer32 are subjected to ion beam via a mask, followed by development. Or, when the first dielectric layer 31 and the second dielectric layer 32 are photoresist, photolithography is performed via a mask, i.e. exposure followed by development. Patterning of the first dielectric layer 31 and the second dielectric layer 32 can be carried out using the same mask, in the same step. For example, a gray-tone mask is used for a single exposure, which forms a first alignment film 310 in the LCD area and a second alignment film 320 in the OTFT area simultaneously. Or, two masks with two process steps can also be used. In this case, the OTFT area is covered, and the first dielectric layer 31 in the LCD area is patterned to form a first alignment film 310 in the LCD area. Then, the LCD area is covered to carry out the patterning of the second dielectric layer 32 in the OTFT area thus forming the second alignment film 320. By the above-mentioned exposure/development process, a first microgroove 310a and a second microgroove 320a are formed with microgrooves.

In terms of material, the first dielectric layer 31 and the second alignment film 32 can be formed with different materials. For example, a first dielectric layer 31 and a second dielectric layer 32 of two different materials are formed in the LCD area and the OTFT area. Next, two masks are used for two exposures to form a first alignment film 310 in the LCD area and a second alignment film 320 in the OTFT area.

Alternatively, patterning of the first dielectric layer 31 and the second dielectric layer 32 is carried out by polarized light exposure. For example, a photosensitive organic molecular layer, such as polyimide, is used for the first dielectric layer 31 and the second dielectric layer 32. The first dielectric layer 31 is exposed using a first polarized light via a first mask (not shown) to form a first alignment film 310 having a first microgroove of a first molecular arrangement. Next, a portion of the second dielectric layer 32 is exposed using a second polarized light via a second mask (not shown) to form a second alignment film 320 having a partial second microgroove 320a. The first microgroove 310a and the second microgroove 320a can be formed with the same or different molecular alignments in accordance with various requirements.

Figure 1D:
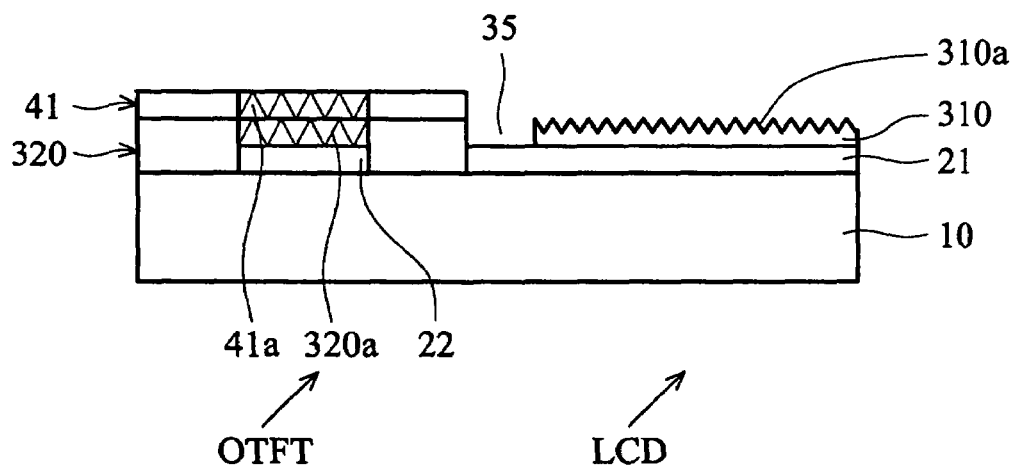

Next, in FIG. 1d, an organic semiconductor layer 41 is formed on the second alignment film 320 in the OTFT area. The organic semiconductor layer 41 is formed aligning the direction of the second microgroove 320a. Part of the organic semiconductor layer 41a is microgroove relative to the position of the second microgroove 320a. The organic semiconductor layer 41 comprises organic small molecules, organic polymer, or organic complex. The formation method of the organic semiconductor layer is preferably vacuum evaporation, vapor deposition, solution deposition, or directional deposition.

Figure 1E:
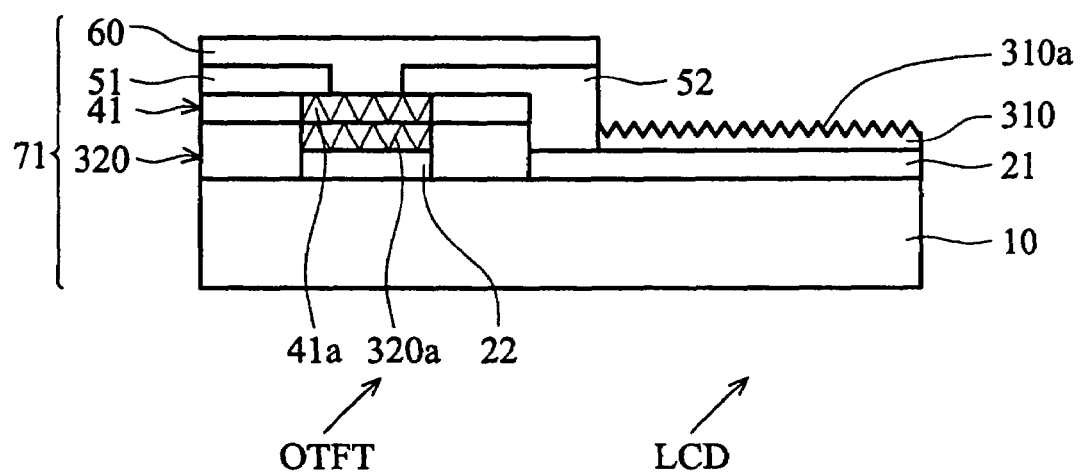

Next, in FIG. 1e, a source 51 and a drain 52 are formed in the OTFT area. The drain 52 must be filled in the opening 35 to be in contact with the pixel electrode 21. The source 51 and the drain 52 are the same material, and formed in the same process step. For example, a conductive layer (not shown) is formed in the OTFT area, followed by patterning to obtain the source 51 and the drain 52.

In order to obtain better carrier transport efficiency OTFT, the source 51 and the drain 52 are preferably positioned to be in contact with the organic semiconductor layer 41a. Therefore, the direction of the channel (current flow) between the source 51 and the drain 52 is the same as the direction of the alignment of the organic semiconductor layer 41a. That is, the direction of the channel and the direction of the alignment of the second microgroove 320a of the second alignment film 320 are identical.

Next, in FIG. 1e, a passivation layer 60 is formed on the organic semiconductor layer 41. This completes the formation of the OTFT array substrate 71. The organic semiconductor array substrate 71 is applicable in transmissive or semi-transflective LCDs. For semi-transflective LCDs, the pixel electrode 21 in the OTFT area acts as the transmissive part, and reflective material, such as Al must be required in the reflective part.

Figure 1F:
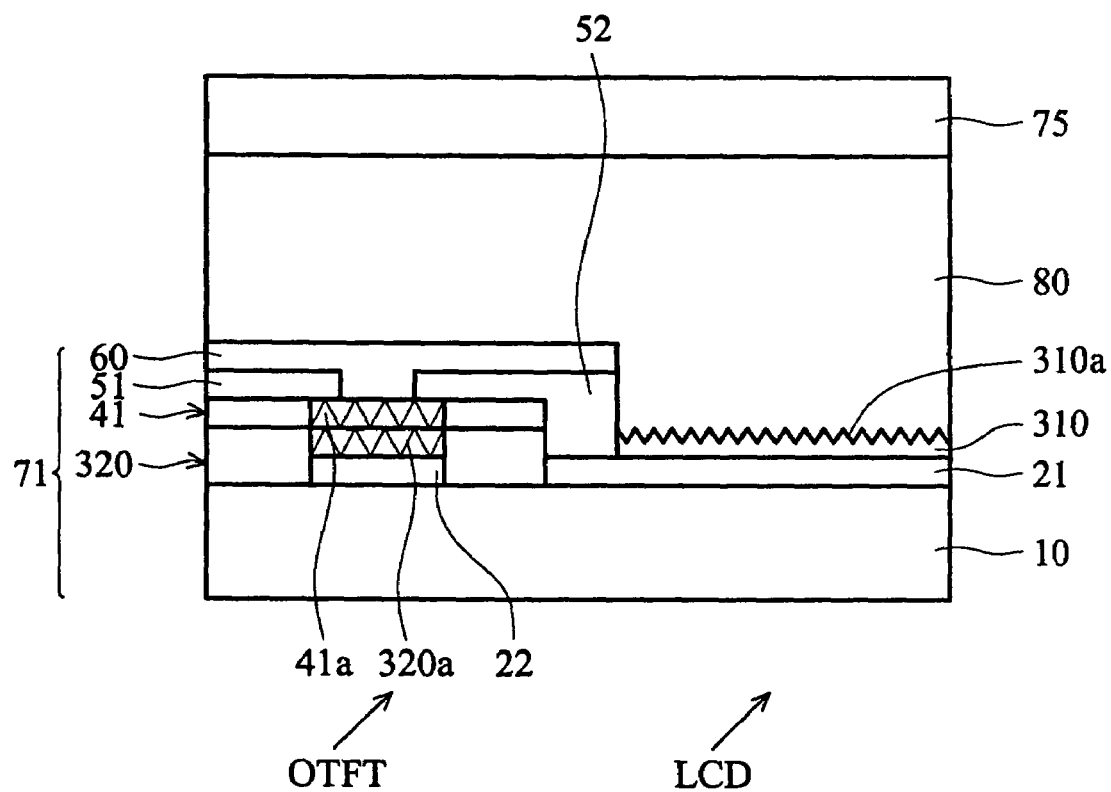

Next, in FIG. 1f, a color filter substrate 75 is provided. Liquid crystal 80 is injected into the space between the organic semiconductor array substrate 71 and the color filter 75 to accomplish the fabrication of LCD.

Figure 2:
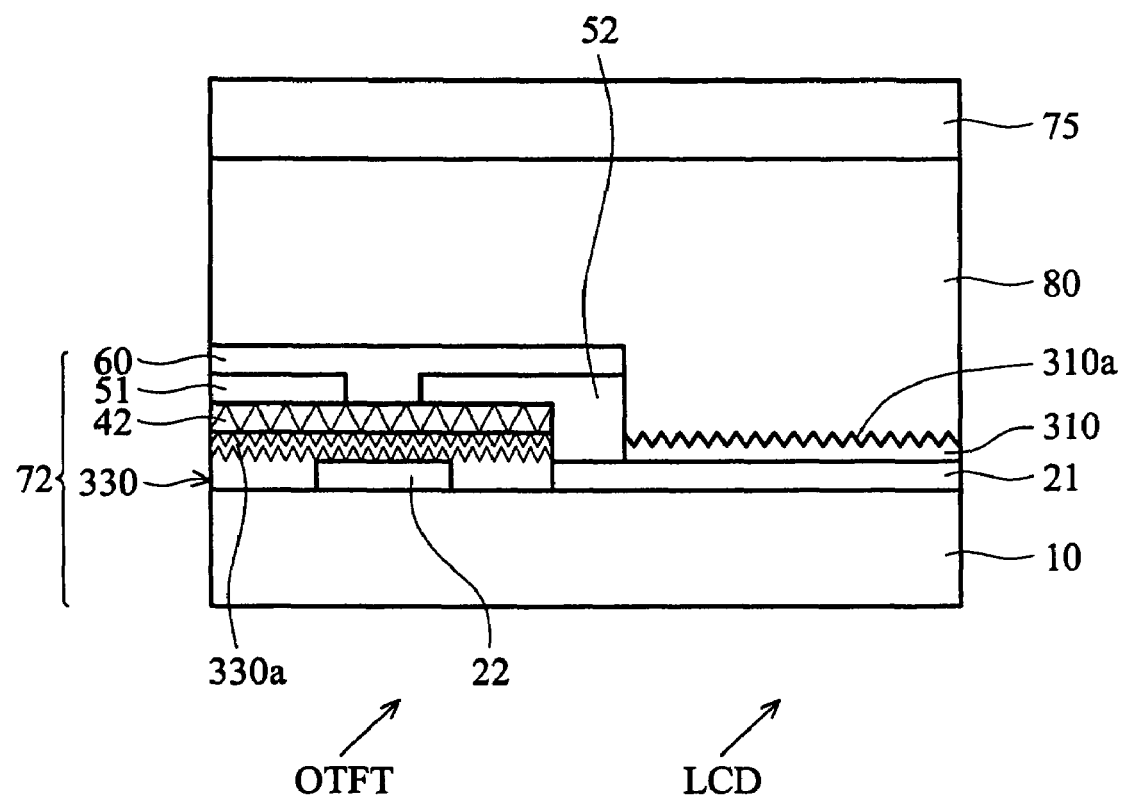
FIG. 2 illustrates a cross section of the LCD having bottom gate type OTFT substrate according to the second embodiment of the invention.

FIG. 2 illustrates a cross section of the LCD having a bottom gate type OTFT array substrate according to the second embodiment of the invention. This LCD comprises: an OTFT array substrate 72, a color filter 75, and liquid crystal 80 between the OTFT array substrate 72 and the color filter 75.

The OTFT array substrate 72 in FIG. 2 comprises: a substrate 10 having an LCD area and an OTFT area; a transparent pixel electrode 21, formed on the substrate 10 in the LCD area; a gate 22, formed on the substrate 10 in the OTFT area; a first alignment film 310, formed on the pixel electrode 21; a second alignment film 330, formed on the substrate 10 in the OTFT area and covering the gate 22; an organic semiconductor layer 42, formed on the second alignment film 330, wherein the organic semiconductor layer 42 is aligned along the direction of the second alignment film 330; and a source 51 and a drain 52, formed in the OTFT area, wherein the source and the drain are in contact with the organic semiconductor layer 42, and a channel is formed between the source and the drain; and a passivation layer 60, formed on the organic semiconductor layer 42.

LCD structures shown in FIG. 2 and FIG. 1f are similar. The major difference being that the entire surface of the second alignment film 330 in FIG. 2 are aligned (shown as "microgroove" in the figure), so that the entire area of the organic semiconductor layer 42 are aligned along the direction of the second alignment film 330.

The method for producing the LCD shown in FIG. 2 is similar to the one for producing the LCD in FIG. 1f. A simplified description is given as follows. A substrate 10 having LCD and OTFT areas is provided, as shown in FIG. 1a. Next, a transparent conductive layer (not shown) is formed on the substrate 10, followed by photolithography and etching to pattern the conductive layer. A pixel electrode 21 and a gate are thus formed in the LCD and OTFT areas respectively.

Next, in FIG. 1b, a dielectric layer (not shown) is formed in the LCD area and the OTFT area to cover the pixel electrode 21 and the gate 22. Then, the dielectric layer is patterned to form an opening 35 so that the dielectric layer is divided into two parts: a first dielectric layer 31 on the pixel electrode 21 and a second dielectric layer 32 on the gate 22.

Next, in FIG. 1b and FIG. 2, the first dielectric layer 31 is patterned to form a first alignment film 310, wherein a first microgroove 310a is formed on the surface of the first alignment film 310. Similarly, the second dielectric layer 32 is patterned to form a second alignment film 32, and a second microgroove 320a is formed on the surface of the second alignment film 320. As shown in FIG. 2, the second alignment film is entirely aligned (microgroove). As a result, the entire area of the organic semiconductor layer 42 is also aligned along the alignment direction of the second alignment film 330.

As described earlier, the arrangement of the first microgroove 310a and the second microgroove 320a can be identical. The method of forming the alignment films, as discussed earlier, can be carried out by traditional exposure/development or polarized light exposure process.

Alternatively, rubbing is also applicable in forming the first alignment film 310 and the second alignment film 330. In FIG. 1b, polyimide (PI) is used to form the first and the second dielectric layers 31 and 32. Rubbing is carried out to form the first and the second alignment films 310 and 330, shown in FIG. 2. By using this method, the first and the second alignment films having the same alignment direction are formed.

Next, in FIG. 2, an organic semiconductor layer 42 is formed on the second alignment film 320. Since the entire surface of the second alignment film 330 is aligned, the organic semiconductor layer 42 is also aligned along the direction of the second alignment film 320. Next, a source 51, a drain 52 and a passivation layer 60 are formed in the OTFT area. This completes the formation of the OTFT array substrate 72. Liquid crystal 80 is injected into the space between the organic semiconductor array substrate 72 and the color filter 75 to accomplish the LCD fabrication.

FIGS. 3a~3f illustrate cross sections of the method of producing an LCD having a top gate type OTFT array substrate according to the third embodiment of the invention.

Figure 3A:
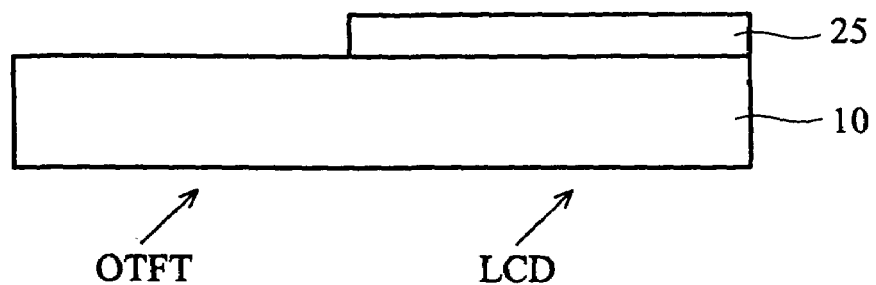
FIGS. 3a~3f illustrate cross sections of the method of producing an LCD having a top gate type OTFT substrate according to the third embodiment of the invention.

In FIG. 3a, a substrate 10 having an LCD and OTFT areas is provided. Suitable substrates are silicon wafer, glass, and quartz, plastic or flexible substrates. A pixel electrode 25, preferably ITO, ZnO or conductive polymer material, is formed on the substrate 10 in the LCD area.

Figure 3B:
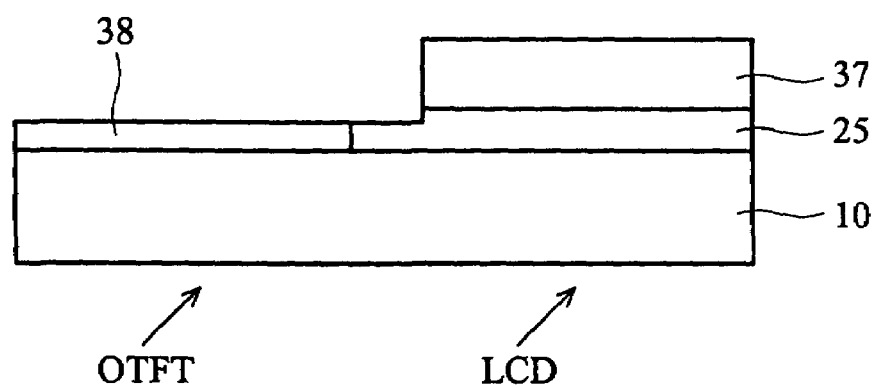

Next, in FIG. 3b, a dielectric layer (not shown) is formed in the LCD area and the OTFT area to cover the pixel electrode 25. Then, the dielectric layer is patterned and divided into two parts: a first dielectric layer 37 on the pixel electrode 25 and a second dielectric layer 38 on the substrate in the OTFT area. Patterning of the dielectric layer is carried out by photolithography and etching. Or, printing is also applicable in forming the first dielectric layer 37 and the second dielectric layer 38 directly.

Figure 3C:
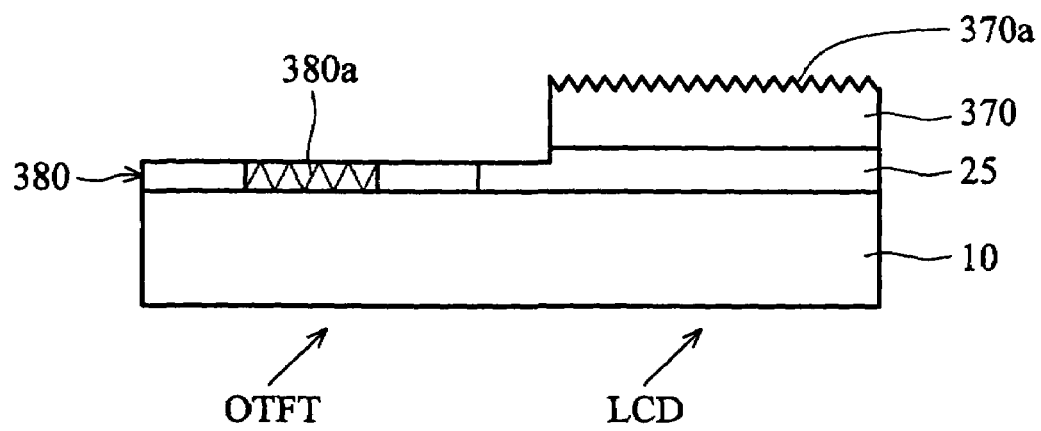

Next, in FIG. 3c, the first dielectric layer 37 is patterned to form a first alignment film 370, wherein a first microgroove 370a is formed on the surface of the first alignment film 370. Similarly, the second dielectric layer 38 is patterned to form a second alignment film 38, and a second microgroove 380a is formed on the surface of the second alignment film 380. As shown in the figure, the second alignment film is not entirely aligned (microgroove), while the portion marked 380a is.

The arrangement of the first microgroove 370a and the second microgroove 380a can be identical, or, they can be different to meet various requirements of the LCD and OTFT areas. Patterning of the first dielectric layer 37 and the second dielectric layer 38 is not restricted, and exposure/development is applicable. The first alignment film 370 and the second alignment film 380 are formed by a conventional photolithography method or polarized light exposure.

Figure 3D:
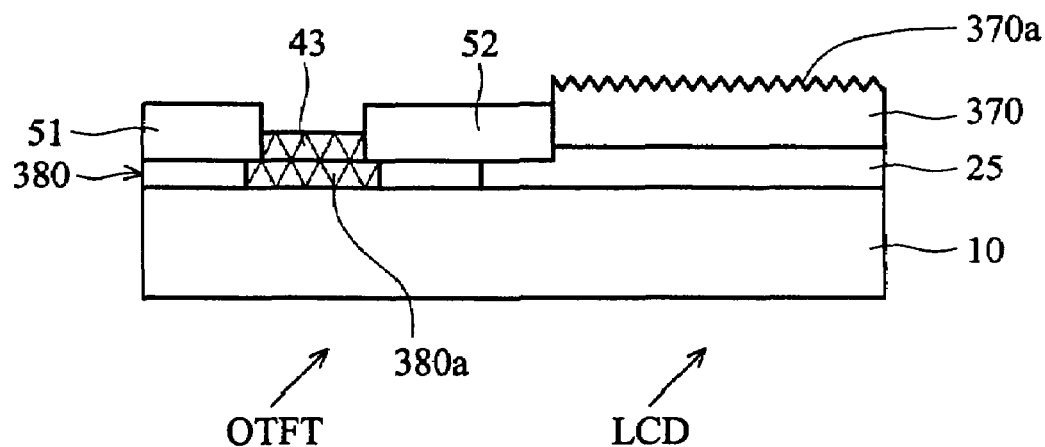

Next, in FIG. 3d, a source 51 and a drain 52 are formed on the second alignment film 380 in the OTFT area. The source 51 and the drain 52 are composed of the same material, and formed in the same process step. For example, a conductive layer (not shown) is formed in the OTFT area, followed by patterning to obtain the source 51 and the drain 52. Next, an organic semiconductor layer is formed among the second microgroove 380a, the source 51 and the drain 52. The organic semiconductor layer is aligned along the direction of the second microgroove 380a, thus forming good orientation organic semiconductor layer 43. Enhanced carrier transport efficiency is thus obtained.

The organic semiconductor layer 43 comprises organic small molecules, organic polymer, or an organic complex. The formation method of the organic semiconductor layer is preferably vacuum evaporation, vapor deposition, solution deposition, or directional deposition.

In order to obtain better carrier transport efficiency OTFT, it is preferably that the direction of the channel (current flow) between the source 51 and the drain 52 is the same as the alignment direction of the organic semiconductor layer 43. That is, the direction of the channel and the direction of the alignment of the second microgroove 380a of the second alignment film 380 are identical.

Figure 3E:
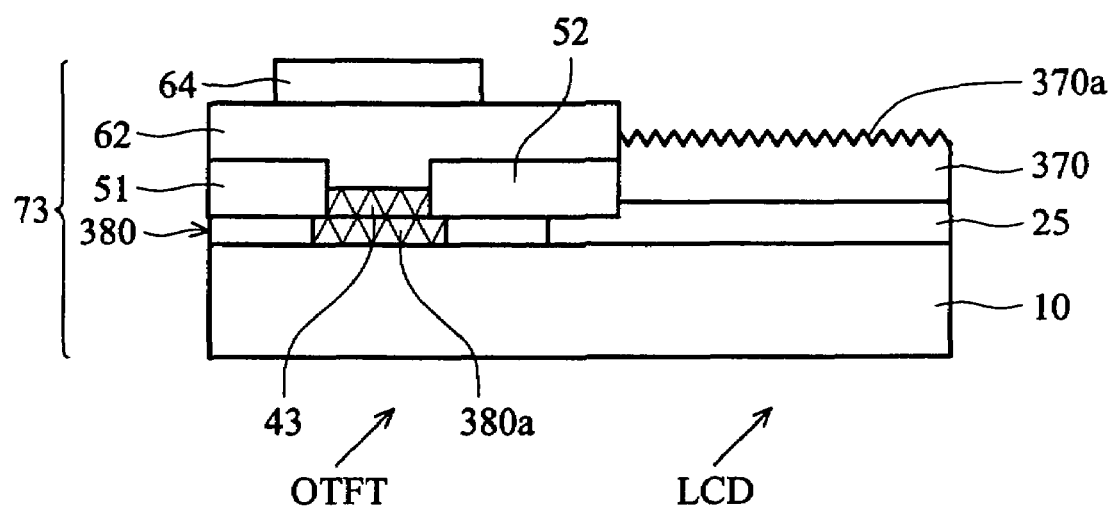

Next, in FIG. 3e, a gate insulation layer 62 is formed on the organic semiconductor layer 43, thus forming a gate 64 on the gate insulation layer 62. This completes the formation of the OTFT array substrate 73. The organic semiconductor array substrate 73 is applicable to transmissive or semi-transflective LCDs. For semi-transflective LCD, the pixel electrode 25 in the OTFT area acts as the transmissive part, and reflective material, such as Al is required in the reflective part.

Figure 3F:
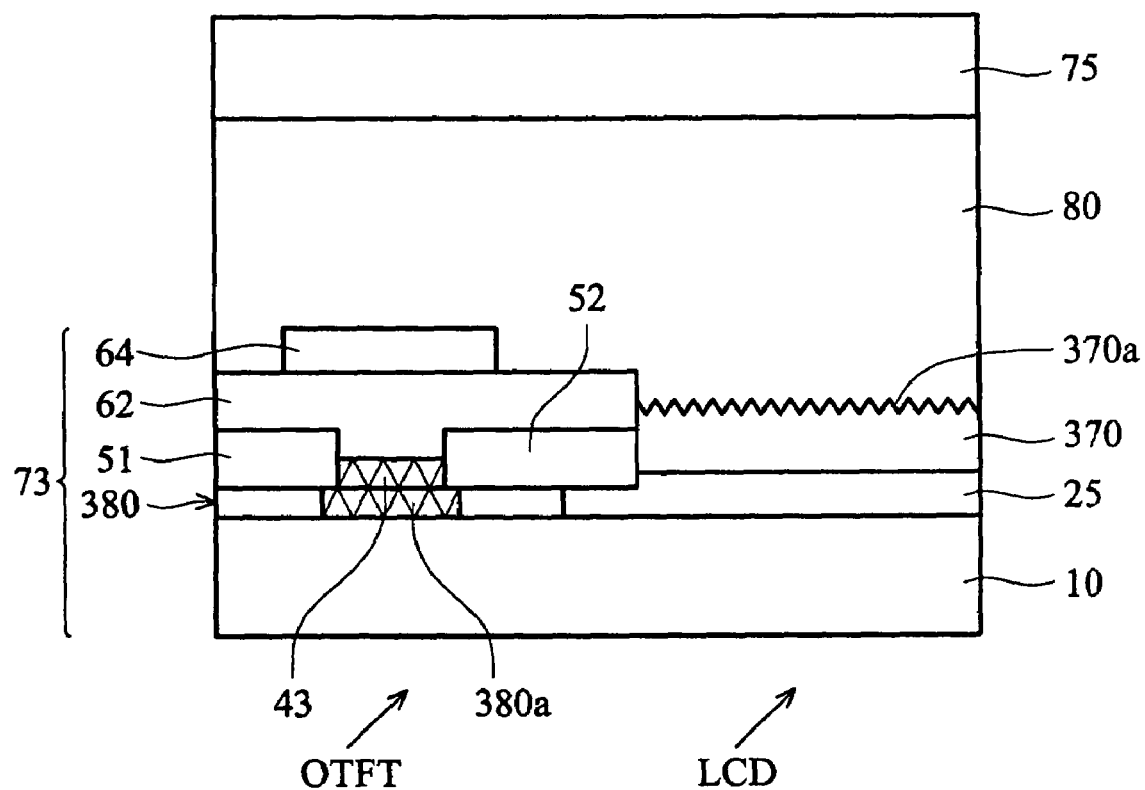

Next, in FIG. 3f, a color filter substrate 75 is provided. Liquid crystal 80 is injected into the space between the organic semiconductor array substrate 73 and the color filter 75 to accomplish LCD fabrication.

In conclusion, a first alignment film is formed on the pixel electrode in the LCD area to arrange the liquid crystals. A second alignment film is then formed in the OTFT area to align with the organic semiconductor material, thus improving carrier transport efficiency. The overall performance of the elements is consequently enhanced and better able to meet circuit design requirements. Moreover, the first and the second alignment films are composed of the same material and formed in the same process step thus simplifying the overall process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements

What is claimed is:

1. A liquid crystal display including an organic thin film transistor array substrate, comprising an organic thin film transistor array substrate, a filter substrate and liquid crystal between the organic thin film transistor array substrate and the filter substrate, wherein the organic thin film transistor array substrate comprises:
   a substrate having an LCD area and an organic thin film transistor (OTFT) area;
   a pixel electrode, formed on the substrate in the LCD area;
   a first alignment film, formed on the pixel electrode;
   a second alignment film, formed on the substrate in the OTFT area;
   an organic semiconductor layer, formed on the second alignment film, wherein the organic semiconductor layer is aligned along the direction of the second alignment film; and
   a gate, a source and a drain, formed in the OTFT area, wherein the source and the drain are in contact with the organic semiconductor layer, and a channel is formed between the source and the drain.

2. The substrate as claimed in claim 1, wherein the first alignment film and the second alignment are the same material formed in the same process step.

3. The substrate as claimed in claim 1, wherein the pixel electrode and the gate are the same material formed in the same process step.

4. The substrate as claimed in claim 1, wherein the pixel electrode is transparent material.

5. The substrate as claimed in claim 1, wherein the direction of the source and the drain is aligned with that of the second alignment film.

6. The substrate as claimed in claim 1, wherein the entire surface of the second alignment film is aligned.

7. The substrate as claimed in claim 1, wherein there is alignment on a partial surface of the second alignment film.

* * * * *